United States Patent
Min et al.

(10) Patent No.: US 9,953,688 B1
(45) Date of Patent: Apr. 24, 2018

(54) PRECHARGE CONTROL DEVICE AND SEMICONDUCTOR DEVICE INCLUDING THE SAME

(71) Applicant: SK hynix Inc., Icheon-si, Gyeonggi-do (KR)

(72) Inventors: Jin Yong Min, Icheon-si (KR); Dong Yoon Ka, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/479,431

(22) Filed: Apr. 5, 2017

(30) Foreign Application Priority Data

Oct. 4, 2016 (KR) .................. 10-2016-0127651

(51) Int. Cl.
G11C 7/10 (2006.01)
G11C 7/12 (2006.01)
G11C 7/22 (2006.01)

(52) U.S. Cl.
CPC .............. G11C 7/12 (2013.01); G11C 7/10 (2013.01); G11C 7/22 (2013.01)

(58) Field of Classification Search
CPC .............. G11C 7/12; G11C 7/10; G11C 7/22
See application file for complete search history.

(56) References Cited

U.S. PATENT DOCUMENTS

| 7,911,862 | B2 | 3/2011 | Kim et al. | |
|---|---|---|---|---|
| 9,659,615 | B1 * | 5/2017 | Kwak | G11C 7/12 |
| 2009/0059700 | A1 * | 3/2009 | Yoo | G11C 7/1018 |
| | | | | 365/203 |
| 2011/0158020 | A1 * | 6/2011 | Hwang | G11C 7/12 |
| | | | | 365/203 |
| 2015/0213856 | A1 * | 7/2015 | Park | G11C 7/1048 |
| | | | | 365/203 |

FOREIGN PATENT DOCUMENTS

KR 100940850 B1 2/2010

* cited by examiner

*Primary Examiner* — Toan Le
(74) *Attorney, Agent, or Firm* — William Park & Associates Ltd.

(57) ABSTRACT

A precharge control device includes a pulse generator, a bank address controller, and a precharge signal generator. The pulse generator generates a write precharge signal in response to a write burst end signal activated after a write burst operation and a read precharge signal in response to a read burst end signal activated after a read burst operation. The bank address controller generates a write address and a read address designating an address for the precharge operation in response to a write bank address and a read bank address. The precharge signal generator generates a precharge signal for performing the precharge operation in a bank selected in response to the write address when the write precharge signal is activated, or generates a precharge signal for performing the precharge operation in a bank selected in response to the read address when the read precharge signal is activated.

18 Claims, 5 Drawing Sheets

FIG. 5

PRECHARGE CONTROL DEVICE AND SEMICONDUCTOR DEVICE INCLUDING THE SAME

CROSS-REFERENCE TO RELATED APPLICATION

This application claims priority based upon Korean patent application number 10-2016-0127651 filed on Oct. 4, 2016, the disclosure of which is incorporated herein by reference in its entirety.

BACKGROUND

Embodiments of the present disclosure generally relate to a precharge control device and a semiconductor device including the same, and more particularly to a technology for reducing the size of a region of a precharge circuit.

Generally, a memory cell array of a semiconductor memory device may be divided into multiple banks so that a plurality of memory banks can simultaneously work on different requests. For example, a precharge timing may vary depending on memory banks. The semiconductor memory device may perform a data write operation in response to a write command including an auto precharge command. Upon completion of the write operation, the semiconductor memory device may automatically disable word lines. The above-mentioned operations may be carried out by an auto-precharge control circuit contained in the semiconductor memory device.

If the write command including the auto-precharge command is input to the semiconductor memory device, the auto-precharge control circuit may automatically generate a precharge signal at a predetermined time after the write operation of target memory cells (or target memory bank) of the semiconductor memory device has been completed. As a result, a row activation circuit (or a row decoder) may disable word lines connected to the write-operation-completed memory cells (or memory bank) in response to the precharge signal.

An auto precharge involves individual bank precharging, and it is possible for each bank to have its own auto-precharge control circuit to generate an auto-precharge signal per bank. Assuming that the semiconductor memory device includes eight banks, if each bank has its own auto-precharge control circuit, the semiconductor memory device will need a total of eight auto-precharge control circuits, and this may lead to an increase in a size of the semiconductor memory device. Moreover, a space occupied by the auto-precharge control circuits increases as the number of banks increases.

SUMMARY

In an embodiment of the present disclosure, a precharge control device may include a pulse generator, a bank address controller, and a precharge signal generator. The pulse generator may generate a write precharge signal in response to a write burst end signal activated after a write burst operation and may generate a read precharge signal in response to a read burst end signal activated after a read burst operation, the write precharge signal and the read precharge signal being used to control a precharge operation. The bank address controller may generate a write address and a read address designating an address for the precharge operation in response to a write bank address and a read bank address. The precharge signal generator may generate a precharge signal that is used to perform the precharge operation in a bank selected in response to the write address when the write precharge signal is activated, or may generate a precharge signal that is used to perform the precharge operation in a memory bank selected in response to the read address when the read precharge signal is activated.

In an embodiment of the present disclosure, a semiconductor device may include a plurality of banks and a precharge controller. A precharge operation may be performed in a bank selected in response to a precharge signal. The precharge controller may generate a pulse signal that is used to perform a precharge operation after completion of a burst operation, and may control the precharge signal in response to a write address and a read address when the pulse signal is activated. The precharge controller may be shared by the plurality of memory banks.

DETAILED DESCRIPTION

Reference will now be made in detail to the embodiments of the present disclosure, examples of which are illustrated in the accompanying drawings. Wherever possible, the same reference numbers will be used throughout the drawings to refer to the same or like parts.

The embodiment of the present disclosure relates to a technology for allowing a plurality of banks to share a precharge control circuit configured to generate a precharge signal, resulting in reduction in size of the precharge control circuit.

Figure 1:
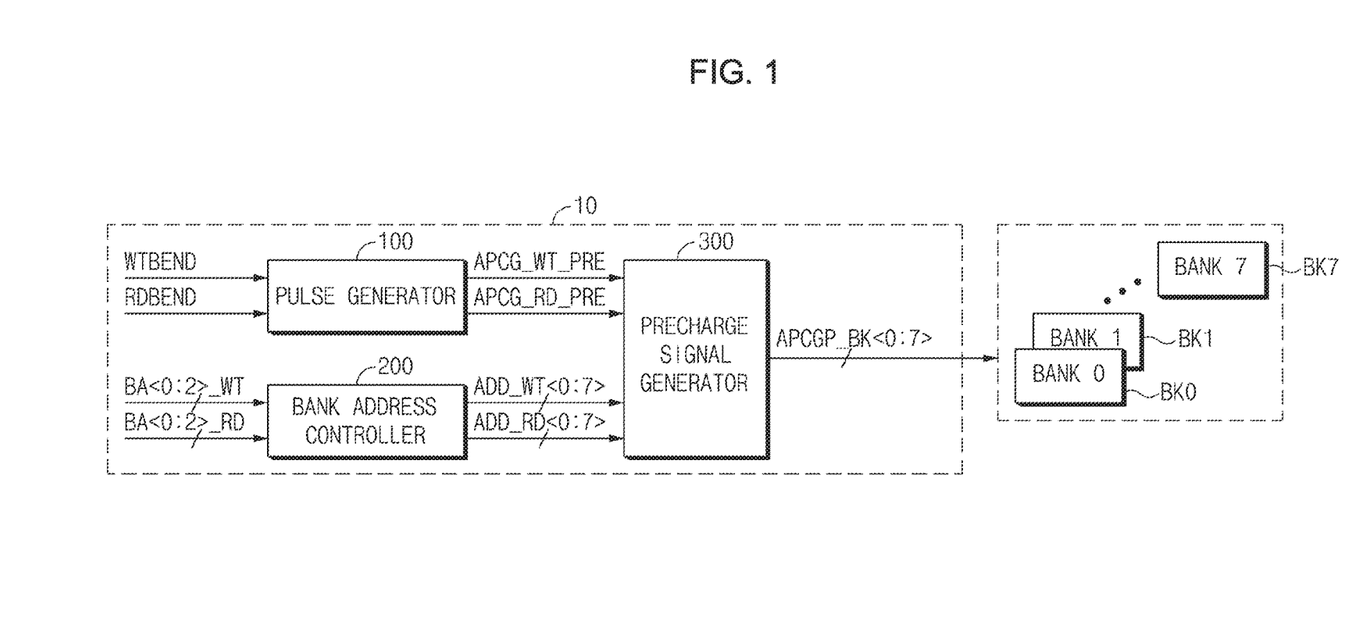
FIG. 1 is a diagram illustrating an example of a semiconductor device including a precharge control device according to an embodiment of the present disclosure.

FIG. 1 is a diagram illustrating an example of a semiconductor device including a precharge control device according to an embodiment of the present disclosure.

Referring to FIG. 1, the semiconductor device according to an embodiment may include a precharge control device 10 and a plurality of banks BK0 to BK7. In this case, the precharge control device 10 may include a pulse generator 100, a bank address controller 200, and a precharge signal generator 300. Here, it is assumed that eight banks BK0 to BK7 share a single precharge control device 10 for convenience of description.

The pulse generator 100 may generate a write precharge signal APCG_WT_PRE in response to a write burst end signal WTBEND, and may generate a read precharge signal APCG_RD_PRE in response to a read burst end signal RDBEND.

Here, when the write burst end signal WTBEND is activated after the write operation is performed in response to a write command for a predetermined period of time corresponding to a burst length, the write precharge signal APCG_WT_PRE may be activated to perform a precharge operation. To put it another way, the write precharge signal APCG_WT_PRE may be activated in response to the write burst end signal WTBEND activated after a write burst operation. When the read burst end signal RDBEND is activated after the read operation is performed in response to a read command for a predetermined period of time corresponding to the burst length, the read precharge signal APCG_RD_PRE may be activated. To put it another way, the read precharge signal APCG_RD_PRE may be activated in response to the read burst end signal RDBEND activated after a read burst operation.

After certain memory cells are accessed in response to the write command or the read command to input/output data during the period of time corresponding to the burst length, the precharge operation may be automatically performed on the memory cells. This precharge operation will hereinafter be referred to as an auto-precharge operation. After the period of time corresponding to the burst length, the write burst end signal WTBEND or the read burst end signal RDBEND may be activated. As a result, the pulse generator 100 may activate the write precharge signal APCG_WT_PRE or the read precharge signal APCG_RD_PRE to control the precharge signal APCGP_BK<0:7>.

Here, the write burst end signal WTBEND may be generated based on the write command received from a controller (not illustrated) that is provided to control the semiconductor device. Likewise, the read burst end signal RDBEND may be generated based on the read command received from the controller.

In response to the write bank address BA<0:2>_WT, the bank address controller 200 may generate the write address ADD_WT<0:7> indicating memory cells on which the precharge operation will be performed. Likewise, in response to the read bank address BA<0:2>_RD, the bank address controller 200 may generate the read address ADD_RD<0:7> indicating memory cells on which the precharge operation will be performed. Here, the write address ADD_WT<0:7> may be used to select a precharge-target memory bank in which the precharge operation will be performed after the write operation has been completed, and the read address ADD_RD<0:7> may be used to select a precharge-target memory bank in which the precharge operation will be performed after the read operation has been completed.

Although three write bank addresses BA<0:2>_WT and three read bank addresses BA<0:2>_RD are provided here, the number of input bank addresses is not limited thereto. Although eight write addresses ADD_WT<0:7> indicating the output signals of the bank address controller 200 and eight read addresses ADD_RD<0:7> indicating the output signals of the bank address controller 200 are provided here, the number of output addresses is not limited thereto, and may vary depending on the number of banks.

Here, the write bank address BA<0:2>_WT and the read bank address BA<0:2>_RD may be received from a controller (not illustrated) that is provided to control the semiconductor device.

In response to the write precharge signal APCG_WT_PRE and the write address ADD_WT<0:7>, the precharge signal generator 300 may generate the precharge signal APCGP_BK<0:7> to perform the precharge operation on selected banks. In addition, in response to the read precharge signal APCG_RD_PRE and the read address ADD_RD<0:7>, the precharge signal generator 300 may generate the precharge signal APCGP_BK<0:7> to perform the precharge operation on selected banks.

In an embodiment, the precharge signal APCGP_BK<0:7> generated by the precharge signal generator 300 may be an auto-precharge signal, which is used to perform the auto-precharge operation. Assuming that a write auto precharge command (e.g., WTA) or a read with auto precharge command (e.g., RDA) is input to the semiconductor memory device (e.g., DRAM), the write or read operation may be followed by the auto-precharge operation in response to the auto-precharge signal.

If the precharge signal APCGP_BK<0:7> is activated after completion of the write or read operation, the precharge operation is performed in the bank selected between the plurality of banks BK0 to BK7. That is, the word line of the bank selected by activation of the precharge signal APCG_BK<0:7> is disabled, and the precharge operation is then performed. Although eight banks BK0 to BK7 are provided here for convenience of description, the number of banks is not limited thereto.

Figure 2:
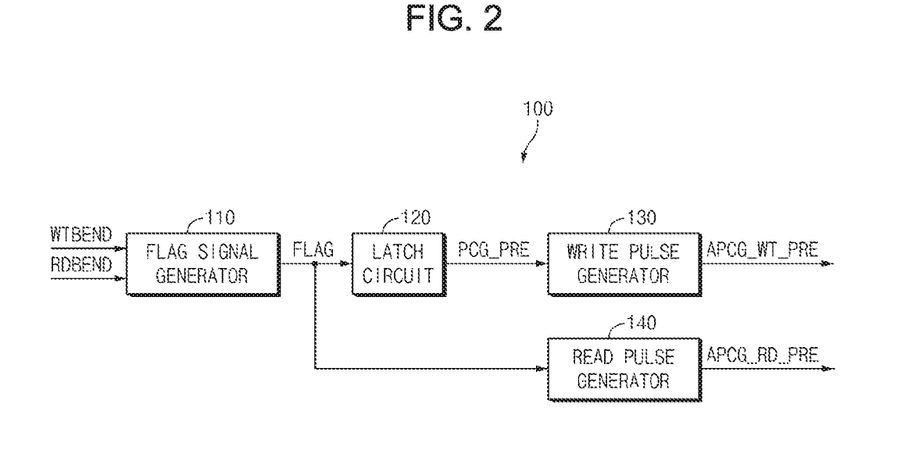
FIG. 2 is a diagram illustrating an example of a pulse generator illustrated in FIG. 1.

FIG. 2 is a diagram illustrating an example of the pulse generator 100 illustrated in FIG. 1.

Referring to FIG. 2, the pulse generator 100 may include a flag signal generator 110, a latch circuit 120, a write pulse generator 130, and a read pulse generator 140. Here, the write pulse generator 130 may be a pulse generator for write operation, and the read pulse generator 140 may be a pulse generator for read operation.

The flag signal generator 110 may generate a flag signal FLAG in response to the write burst end signal WTBEND or the read burst end signal RDBEND. The write burst end signal WTBEND and the read burst end signal RDBEND may be used to indicate a start time of the precharge operation after completion of a burst operation.

The write burst end signal WTBEND involves the write operation, and the read burst end signal RDBEND involves the read operation. After the write command is issued, if the burst operation is completed, the write burst end signal WTBEND may be activated. After the read command is issued, if the burst operation is completed, the read burst end signal RDBEND may be activated.

The flag signal generator 110 may activate the flag signal FLAG when any one of the write burst end signal WTBEND and the read burst end signal RDBEND is activated after completion of the burst operation.

The latch circuit 120 may generate a precharge latch signal PCG_PRE by latching the flag signal FLAG for a predetermined period of time. The write pulse generator 130 may generate the write precharge signal APCG_WT_PRE to control the precharge operation in response to the precharge latch signal PCG_PRE. The read pulse generator 140 may generate a read precharge signal APCG_RD_PRE to control the precharge operation in response to the flag signal FLAG.

The precharge control device 10 may generate the precharge signal APCGP_BK<0:7> at different times depending on whether it is in the read operation mode or the write operation mode. For example, the precharge control device 10 may activate the precharge signal APCGP_BK<0:7> at an earlier point in time when it is in the read operation than when it is in the write operation.

For example, the precharge signal (APCGP_BK<0:7>) may be activated in response to the read command without adding unnecessary delay. However, since a precharge operation can be performed only after a write recovery time (e.g., tWR), the precharge signal APCGP_BK<0:7> is activated at an earlier point in time when it is in the read operation than when it is in the write operation. Here, the write recovery time (e.g., tWR) may a necessary time to guarantee data in a write buffer can be written safely in a memory cell before performing a precharge operation.

Accordingly, the write pulse generator 130 may generate the write precharge signal APCG_WT_PRE in response to the precharge latch signal PCG_PRE provided after a predetermined delay time. In contrast, the read precharge controller 140 may activate the read precharge signal APCG_RD_PRE when the flag signal FLAG is activated without a predetermined delay time.

Figure 3:
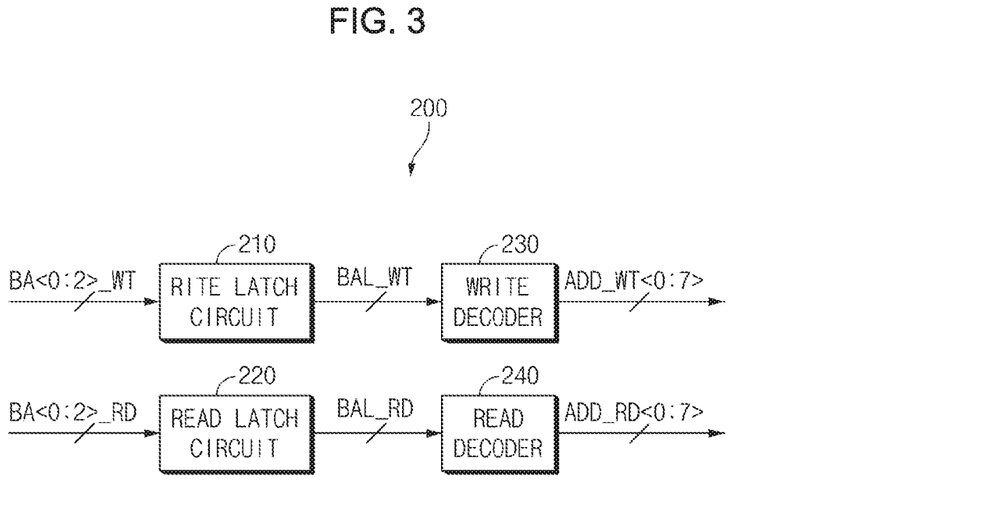
FIG. 3 is a diagram illustrating an example of a bank address controller illustrated in FIG. 1.

FIG. 3 is a diagram illustrating an example of the bank address controller 200 illustrated in FIG. 1.

Referring to FIG. 3, the bank address controller 200 may include a write latch circuit 210, a read latch circuit 220, a write decoder 230, and a read decoder 240. Here, the write latch circuit 210 may be a latch circuit for write operation, and the read latch circuit 220 may be a latch circuit for read operation.

The write latch circuit 210 may latch the write bank address BA<0:2>_WT for a predetermined period of time, and may output a latch address BAL_WT. The read latch circuit 220 may latch the read bank address BA<0:2>_RD for a predetermined period of time, and output a latch address BAL_RD.

Here, the write latch circuit 210 may include pipeline registers/latches. The write latch circuit 210 may store a plurality of input write bank addresses BA<0:2>_WT for a predetermined period of time, and may then sequentially output the stored write bank addresses BA<0:2>_WT. Likewise, the read latch circuit 220 may include pipeline registers/latches. The read latch circuit 220 may store a plurality of input read bank addresses BA<0:2>_RD for a predetermined period of time, and may then sequentially output the stored read bank addresses BA<0:2>_RD.

In addition, the write decoder 230 may generate the write address ADD_WT<0:7> by decoding the latch address BAL_WT. The read decoder 240 may generate the read address ADD_RD<0:7> by decoding the latch address BAL_RD.

Figure 4:
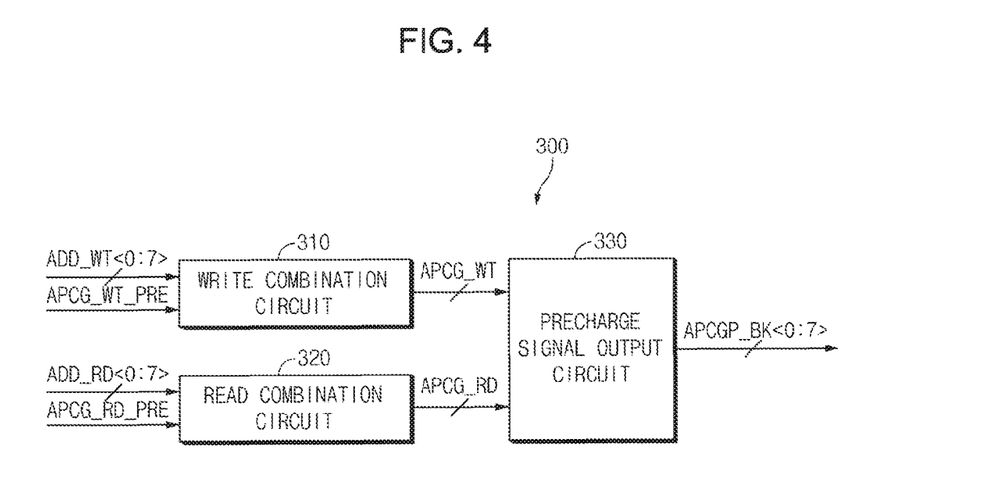
FIG. 4 is a diagram illustrating an example of a precharge signal generator illustrated in FIG. 1.

FIG. 4 is a diagram illustrating an example of the precharge signal generator 300 illustrated in FIG. 1.

Referring to FIG. 4, the precharge signal generator 300 may include a write combination circuit 310, a read combination circuit 320, and a precharge signal output circuit 330. Here, the write combination circuit 310 may be a circuit for write operation, and the read combination circuit 320 may be a circuit for read operation.

The write combination circuit 310 may output the precharge activation signal APCG_WT, which is used to control the precharge operation of the bank selected based on the write address ADD_WT<0:7> and the write precharge signal APCG_WT_PRE. Here, the write combination circuit 310 may activate and output the precharge activation signal APCG_WT when both the write address ADD_WT<0:7> and the write precharge signal APCG_WT_PRE are activated.

The read combination circuit 320 may output the precharge activation signal APCG_RD, which is used to control the precharge operation of the bank selected based on the read address ADD_RD<0:7> and the read precharge signal APCG_RD_PRE. Here, the read combination circuit 320 may activate and output the precharge activation signal APCG_RD when both the read address ADD_RD<0:7> and the read precharge signal APCG_RD_PRE are activated.

In addition, the precharge signal output circuit 330 may activate the precharge signal APCGP_BK<0:7>, which is used to perform the precharge operation, in response to the precharge activation signal APCG_WT or the precharge activation signal APCG_RD. If any one of the precharge activation signal APCG_WT and the precharge activation signal APCG_RD is activated, the precharge signal output circuit 330 may activate and output the precharge signal APCGP_BK<0:7>.

Figure 5:
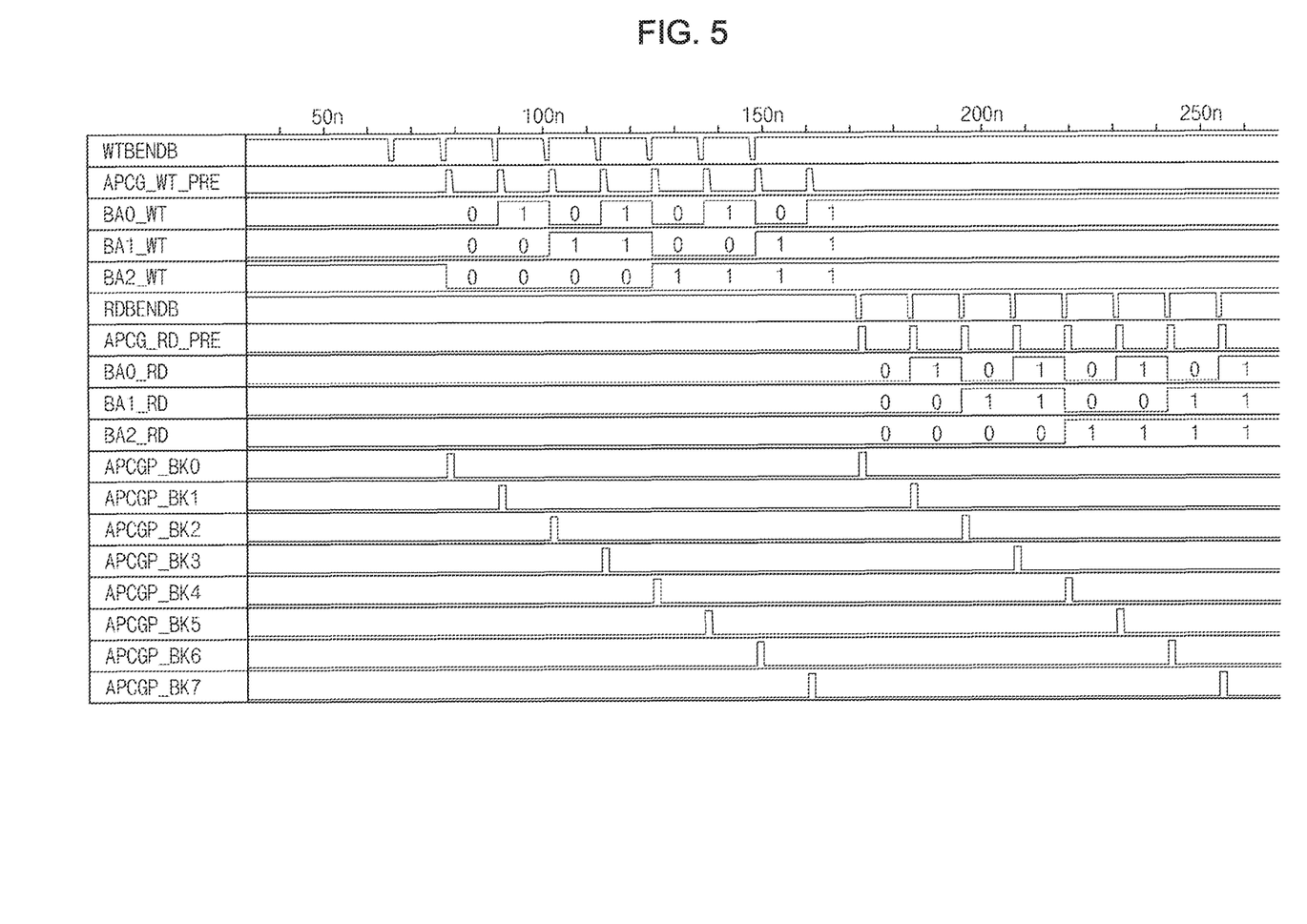
FIG. 5 is a waveform diagram illustrating an example of a precharge control device according to an embodiment of the present disclosure.

FIG. 5 is a waveform diagram illustrating an example of the precharge control device 10 according to an embodiment of the present disclosure.

Referring to FIG. 5, after the lapse of the burst length period after the write command is applied to the precharge control device 10, the write burst end signal WTBEND is activated to a high level. In FIG. 5, the write burst end signal WTBEND and a complementary write burst end signal WTBENDB may oscillate in opposite phase. Although FIGS. 1 and 2 illustrates the write burst end signal WTBEND for convenience of description, FIG. 5 illustrates a complementary write burst end signal WTBENDB generated by inverting the write burst end signal WTBEND. Here, the complementary write burst end signal WTBENDB may be a signal that is enabled when it is at a low level.

If the write burst end signal WTBENDB is activated (e.g., a low level), after delaying it for a predetermined delay time, the write precharge signal APCG_WT_PRE is activated (e.g., a high level). The predetermined delay time of the latch circuit 120 may be the write recovery time (e.g., tWR) in which data can be stably written in a memory cell. A precharge operation can be performed only after the write recovery time (e.g., tWR) has passed since the data writing started. For this reason, the write precharge signal APCG_WT_PRE may be activated after the predetermined delay time of the latch circuit 120 has passed.

In a situation where the write precharge signal APCG_WT_PRE is activated, if the latch address BAL_WT, which has been obtained by latching the write bank address BA<0:2>_WT for a predetermined period of time, is input to the write combination circuit 310, the write combination circuit 310 may sequentially activate the precharge signal APCGP_BK<0:7> and then output the activated precharge signal APCGP_BK<0:7> to the corresponding bank.

For example, assuming that the write bank address BA<0:2>_WT is "000," the precharge signal APCGP_BK0, which is used to select/precharge the first bank BK0, may be activated. Assuming that the write bank address BA<0:2>_WT is "100," the precharge signal APCGP_BK1, which is used to select/precharge the second bank BK1, may be activated.

Assuming that the write bank address BA<0:2>_WT is "010," the precharge signal APCGP_BK2, which is used to select/precharge the third bank BK2, may be activated. Assuming that the write bank address BA<0:2>_WT is "110," the precharge signal APCGP_BK3, which is used to select/precharge the fourth bank BK3, may be activated.

In addition, assuming that the write bank address BA<0:2>_WT is "001," the precharge signal APCGP_BK4, which is used to select/precharge the fifth bank BK4, may be activated. Assuming that the write bank address BA<0:2>_WT is "101," the precharge signal APCGP_BK5, which is used to select/precharge the sixth bank BK5 may be activated.

Assuming that the write bank address BA<0:2>_WT is "011," the precharge signal APCGP_BK6, which is used to select/precharge the seventh bank BK6, may be activated. Assuming that the write bank address BA<0:2>_WT is "111," the precharge signal APCGP_BK7, which is used to select/precharge the eighth bank BK7, may be activated.

After the lapse of the burst length period after the read command is applied to the precharge control device 10, the read burst end signal RDBEND is activated (e.g., a high level). In FIG. 5, the read burst end signal RDBEND and the other read burst end signal RDBENDB may oscillate in opposite phase. Although FIGS. 1 and 2 illustrates the read burst end signal RDBEND for convenience of description, FIG. 5 illustrates a complementary read burst end signal RDBENDB generated by inverting the write burst end signal RDBEND. Here, the complementary read burst end signal RDBENDB may be a signal that is enabled when it is at a low level.

If the read burst end signal RDBENDB is activated (e.g., a low level), the read precharge signal APCG_RD_PRE may be activated (e.g., a high level).

The write pulse generator 130 may generate the write precharge signal APCG_WT_PRE in response to the precharge latch signal PCG_PRE provided by the latch circuit 120. Therefore, the write precharge signal APCG_WT_PRE may be activated after a predetermined period of time has passed since the write burst end signal WTBENDB was activated. In contrast, the output signal of the read pulse generator 140 does not pass through the latch circuit. As a result, if the read burst end signal RDBENDB is activated to a low level, the read precharge signal APCG_RD_PRE may be immediately activated (e.g., a high level).

In a situation where the read precharge signal APCG_RD_PRE is activated, if the latch address BAL_RD, which has been obtained by latching the read bank address BA<0:2>_RD for a predetermined period of time, is input to the read combination circuit 320, the read combination circuit 320 may sequentially activate the precharge signal APCGP_BK<0:7> and then output the activated precharge signal APCGP_BK<0:7> to the corresponding bank.

For example, assuming that the read bank address BA<0:2>_RD is "000," the precharge signal APCGP_BK0, which is used to select/precharge the first bank BK0, may be activated.

Assuming that the read bank address BA<0:2>_RD is "100," the precharge signal APCGP_BK1, which is used to select/precharge the second bank BK1, may be activated.

Assuming that the read bank address BA<0:2>_RD is "010," the precharge signal APCGP_BK2, which is used to select/precharge the third bank BK2, may be activated. Assuming that the read bank address BA<0:2>_RD is "110," the precharge signal APCGP_BK3, which is used to select/precharge the fourth bank BK3, may be activated.

In addition, assuming that the read bank address BA<0:2>_RD is "001," the precharge signal APCGP_BK4, which is used to select/precharge the fifth bank BK4, may be activated. Assuming that the read bank address BA<0:2>_RD is "101," the precharge signal APCGP_BK5, which is used to select/precharge the sixth bank BK5, may be activated.

Assuming that the read bank address BA<0:2>_RD is "011," the precharge signal APCGP_BK6, which is used to select/precharge the seventh bank BK6, may be activated. Assuming that the read bank address BA<0:2>_RD is "111," the precharge signal APCGP_BK7, which is used to select/precharge the eighth bank BK7, may be activated.

Generally, if each memory bank has its own pulse generator for generating the precharge pulse signal, the precharge control circuit as a whole may lead to an increase in a size of the semiconductor memory device.

In an embodiment of the present disclosure, the pulse generator 100 and the bank address controller 200 may perform auto-precharge operations on the plurality of banks BK0 to BK7 by outputting the precharge signal APCG-P_BK<0:7> to a particular bank selected in response to the pulse signal. That is, an embodiment of the present disclosure involves generating the precharge signal using the pulse generator 100, combining the precharge signal with the bank address, outputting the resultant precharge signal to each selected bank, and thus reducing a size of the semiconductor memory device.

As is apparent from the above description, the precharge control circuit for generating the precharge signal may be shared by the plurality of banks, resulting in reduction in size of the precharge control circuit.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A precharge control device comprising:
a pulse generator configured to generate a write precharge signal in response to a write burst end signal activated after a write burst operation and configured to generate a read precharge signal in response to a read burst end signal activated after a read burst operation, the write precharge signal and the read precharge signal being used to control a precharge operation;
a bank address controller configured to generate a write address and a read address designating an address for the precharge operation in response to a write bank address and a read bank address; and
a precharge signal generator configured to generate a precharge signal,
wherein the precharge signal generator includes:
a write combination circuit configured to output a first precharge activation signal in response to the write address and the write precharge signal;
a read combination circuit configured to output a second precharge activation signal in response to the read address and the read precharge signal; and
a precharge signal output circuit configured to generate the precharge signal in response to the first precharge activation signal and the second precharge activation signal.

2. The precharge control device according to claim 1, wherein the precharge signal is an auto-precharge signal.

3. The precharge control device according to claim 1, wherein the write address is an address that is used to select a precharge-target memory bank based on the write bank address when a write operation has been completed.

4. The precharge control device according to claim 1, wherein the read address is an address that is used to select a precharge-target memory bank based on the read bank address when a read operation has been completed.

5. The precharge control device according to claim 1, wherein the pulse generator, the bank address controller, and the precharge signal generator are shared by a plurality of memory banks.

6. The precharge control device according to claim 1, wherein the pulse generator includes:
   a flag signal generator configured to generate a flag signal in response to the write burst end signal and the read burst end signal;
   a latch circuit configured to output a precharge latch signal by latching the flag signal for a predetermined period of time;
   a write pulse generator configured to output the write precharge signal in response to the precharge latch signal; and
   a read pulse generator configured to generate the read precharge signal in response to the flag signal.

7. The precharge control device according to claim 6, wherein the flag signal generator activates the flag signal when any one of the write burst end signal and the read burst end signal is activated upon completion of the burst operation.

8. The precharge control device according to claim 6, wherein the latch circuit latches the flag signal during a write recovery time.

9. The precharge control device according to claim 1, wherein the bank address controller includes:
   a write latch circuit configured to output a first latch address by latching the write bank address for a predetermined period of time;
   a read latch circuit configured to output a second latch address by latching the read bank address for a predetermined period of time;
   a write decoder configured to output the write address by decoding the first latch address; and
   a read decoder configured to generate the read address by decoding the second latch address.

10. The precharge control device according to claim 1, wherein the write combination circuit activates the first precharge activation signal when both the write address and the write precharge signal are activated.

11. The precharge control device according to claim 1, wherein the read combination circuit activates the second precharge activation signal when both the read address and the read precharge signal are activated.

12. The precharge control device according to claim 1, wherein the precharge signal output circuit activates the precharge signal when any one of the first precharge activation signal and the second precharge activation signal is activated.

13. A semiconductor device comprising:
   a plurality of memory banks in which a precharge operation is performed, the precharge operation being performed in a memory bank selected in response to a precharge signal; and
   a precharge controller configured to generate a pulse signal that is used to perform a precharge operation after completion of a burst operation, and control the precharge signal in response to a write address and a read address when the pulse signal is activated, the precharge controller being shared by the plurality of memory banks,
   wherein the precharge controller includes:
   a write combination circuit configured to output a first precharge activation signal in response to the write address and a write precharge signal;
   a read combination circuit outputs a second precharge activation signal in response to the read address and a read precharge signal; and
   a precharge signal output circuit generates the precharge signal in response to the first precharge activation signal and the second precharge activation signal.

14. The semiconductor device according to claim 13, wherein the precharge controller includes:
   a pulse generator configured to generate the write precharge signal in response to the write burst end signal, or generate the read precharge signal in response to the read burst end signal; and
   a bank address controller configured to generate the write address and the read address designating an address for the precharge operation in response to a write bank address and a read bank address.

15. The semiconductor device according to claim 14, wherein the pulse generator includes:
   a flag signal generator configured to generate a flag signal in response to a write burst end signal and a read burst end signal;
   a latch circuit configured to output a precharge latch signal by latching the flag signal for a predetermined period of time;
   a write pulse generator configured to output the write precharge signal in response to the precharge latch signal; and
   a read pulse generator configured to generate the read precharge signal in response to the flag signal.

16. The semiconductor device according to claim 15, wherein the flag signal generator is configured to activate the flag signal when any one of the write burst end signal and the read burst end signal is activated upon completion of the burst operation.

17. The semiconductor device according to claim 14, wherein the bank address controller includes:
   a write latch circuit configured to output a first latch address by latching the write bank address for a predetermined period of time;
   a read latch circuit configured to output a second latch address by latching the read bank address for a predetermined period of time;
   a write decoder configured to output the write address by decoding the first latch address; and
   a read decoder configured to generate the read address by decoding the second latch address.

18. The semiconductor device according to claim 13, wherein:
   the write combination circuit activates the first precharge activation signal when both the write address and the write precharge signal are activated; and
   the read combination circuit activates the second precharge activation signal when both the read address and the read precharge signal are activated.

* * * * *